United States Patent [19]

Furutani

[11] Patent Number: 5,434,533
[45] Date of Patent: Jul. 18, 1995

[54] REFERENCE VOLTAGE GENERATING CIRCUIT TEMPERATURE-COMPENSATED WITHOUT ADDITION OF MANUFACTURING STEP AND SEMICONDUCTOR DEVICE USING THE SAME

[75] Inventor: Kiyohiro Furutani, Hyogo, Japan

[73] Assignee: Mitsubishi Denki Kabushiki Kaisha, Tokyo, Japan

[21] Appl. No.: 999,067

[22] Filed: Dec. 31, 1992

[30] Foreign Application Priority Data

Apr. 6, 1992 [JP] Japan .................. 4-083672

[51] Int. Cl.⁶ .................. G05F 1/10; H03F 1/30
[52] U.S. Cl. .................. 327/538; 327/331; 327/362; 327/513; 323/313; 323/907
[58] Field of Search .................. 307/491, 296.6, 310; 330/110, 256, 260; 323/313, 907; 327/538, 513, 362, 331

[56] References Cited

U.S. PATENT DOCUMENTS

| 3,806,742 | 4/1974 | Powell .................. 307/296.6 |
| 4,185,251 | 1/1980 | Brown, Jr. et al. .................. 330/110 |
| 4,260,946 | 4/1981 | Wheatley, Jr. .................. 307/296.6 |
| 4,287,439 | 9/1981 | Leuschner .................. 307/310 |
| 4,618,816 | 10/1986 | Monticelli .................. 307/296.6 |
| 4,943,945 | 7/1990 | Lai .................. 323/313 |
| 5,086,238 | 2/1992 | Watanabe et al. .................. 307/310 |
| 5,144,223 | 9/1992 | Gillingham .................. 323/315 |
| 5,146,152 | 9/1992 | Jin et al. .................. 323/907 |
| 5,187,685 | 2/1993 | Sato et al. .................. 323/313 |

FOREIGN PATENT DOCUMENTS

0414434A2 2/1991 European Pat. Off. .

OTHER PUBLICATIONS

"A Tunable CMOS-DRAM Voltage Limiter with Stabilized Feedback Amplifier", by M. Horiguchi et al., 1990 Symposium on VLSI Circuits, pp. 75-76.

"Temperature-Compensation Circuit Techniques for High-Density CMOS DRAMs", by D. S. Min et al., pp. 125-126.

Primary Examiner—Timothy P. Callahan
Assistant Examiner—Terry L. Englund
Attorney, Agent, or Firm—Lowe, Price, LeBlanc & Becker

[57] ABSTRACT

In a reference voltage generating circuit having an improved temperature compensation function, a PMOS transistor forming a constant voltage circuit has the same characteristics as a PMOS transistor forming a negative feedback circuit. As an ambient temperature changes, gate-source voltage and drain current characteristics of each transistor are shifted, but temperature compensation is achieved by appropriately setting a drain current of each transistor. Transistors for the temperature compensation can be formed in the same manufacturing steps, so that temperature compensating effect can be obtained without an additional manufacturing step.

11 Claims, 11 Drawing Sheets

REFERENCE VOLTAGE GENERATING CIRCUIT TEMPERATURE-COMPENSATED WITHOUT ADDITION OF MANUFACTURING STEP AND SEMICONDUCTOR DEVICE USING THE SAME

BACKGROUND OF THE INVENTION

1. Field of the Invention

The present invention relates, in general, to a reference voltage generating circuit formed on a semiconductor substrate, and, in particular, to a reference voltage generating circuit which is stabilized by temperature compensation. The present invention has a particular applicability to an internal voltage converting circuit in a semiconductor device.

2. Description of the Background Art

In the semiconductor devices, it has been desired to provide stabilized reference voltage generating circuits which are not affected by the change of the ambient temperature. However, the characteristics of the semiconductors are generally liable to be affected by the change of the ambient temperature. It is, therefore, difficult to stabilize output voltages supplied from the reference voltage generating circuits.

MOS transistors have been used in various semiconductor memory devices such as DRAMs (dynamic random access memories) because of their suitability to high integration and other reasons. Bipolar transistors have been widely used for forming the reference voltage generating circuits on the semiconductor substrates. In the manufacturing steps for manufacturing the semiconductor devices formed of MOS transistors, however, addition of steps for forming bipolar transistors unpreferably complicates the manufacturing steps. This means that it has been generally desired to form the stable reference voltage generating circuits formed of the MOS transistors on the semiconductor substrates.

The reference voltage generating circuits can be applied, for example, as internal voltage converters in the DRAMs. Since the DRAM is generally formed of a large number of CMOS transistors, the stable internal voltage converters formed of the CMOS transistors, i.e., stable reference voltage generating circuits have been desired. In general, it is noted that the invention is preferably applied to the semiconductor device requiring a reference voltage generating circuit formed of field effect transistors.

Figure 14:
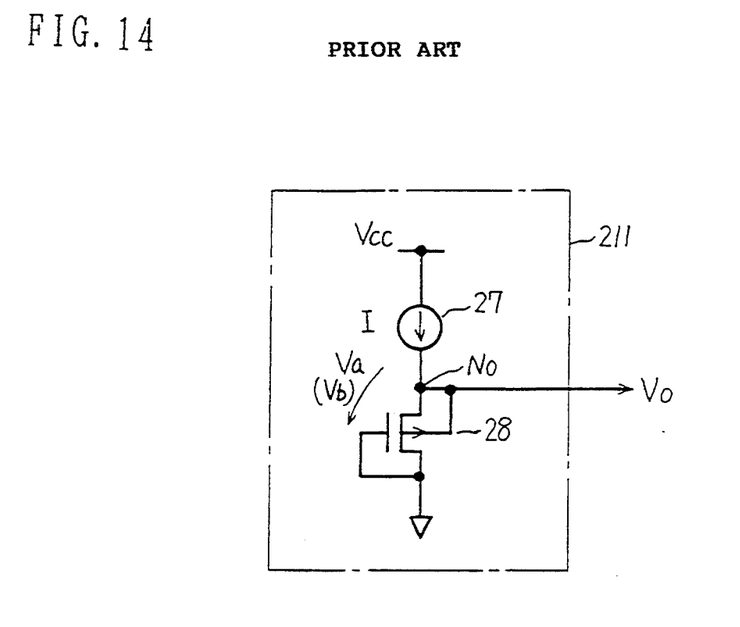
FIG. 14 is a schematic diagram of an example of a reference voltage generating circuit in the prior art.

FIG. 14 is a schematic diagram showing an example of a reference voltage generating circuit in the prior art. Referring to FIG. 14, a reference voltage generating circuit 211 includes a constant current source 27 and a PMOS transistor 28 connected in series between a power supply potential Vcc and the ground. The constant current source 27 and transistor 28 have a common connection node No through which a reference voltage, i.e., output voltage Vo is supplied. The transistor 28 has its gate and drain connected together.

Figure 16:
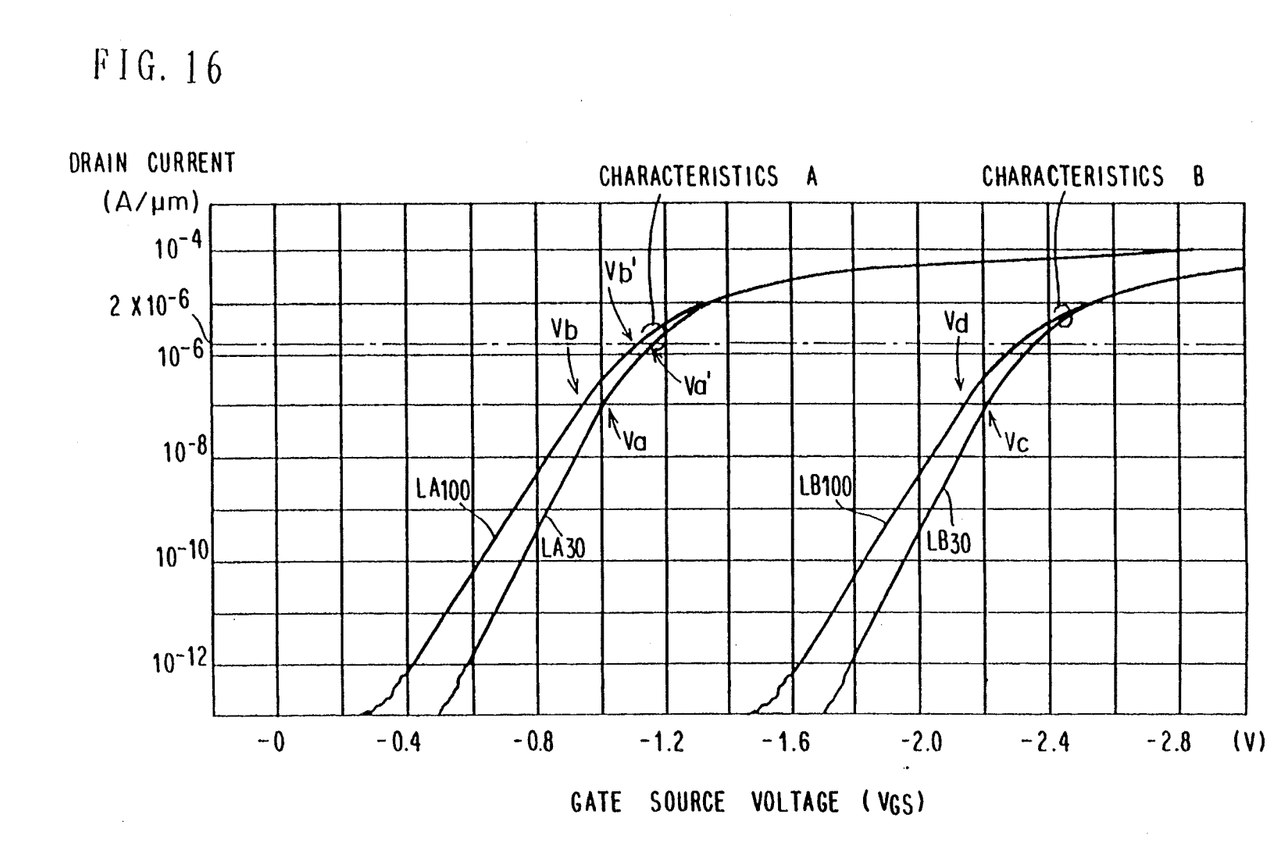
FIG. 16 is a schematic diagram showing gate-drain voltage and drain current characteristics of transistors shown in FIGS. 13 and 14.

FIG. 16 is a characteristic diagram showing relationship between a voltage across the gate and source of the transistor 28 in FIG. 14 and a drain current thereof. Referring to FIG. 16, the abscissa indicates the voltage $V_{GS}$ (volt) across the gate and source, and the ordinate indicates the drain current (A/$\mu$m) per channel width of 1 $\mu$m. The characteristics of the transistor 28 shown in FIG. 14 are represented by characteristics A indicated by lines LA30 and LA100 in FIG. 16. The line LA30 indicates the characteristics at the ambient temperature of 30° C., and the line LA100 indicates the characteristics at the ambient temperature of 100° C.

Assuming that the constant current source 27 shown in FIG. 14 supplies the drain current of $10^{-7}$ (A/$\mu$m), the gate-source voltage $V_{GS}$ of transistor 28 is Va ($=-1.0$) at the ambient temperature of 30° C. and is Vb ($=-0.94$) at the ambient temperature of 100° C. The reference voltage generating circuit 211 shown in FIG. 14 supplies the output voltage Vo of $|Va|=1.0$ V at the ambient temperature of 30° C. and of $|Vb|=0.94$ V at the ambient temperature of 100° C. Therefore, a voltage fluctuation ratio of the reference voltage generating circuit 211 is $(1.0-0.94)/1.0 \times 100 = 6\%$.

Figure 15:
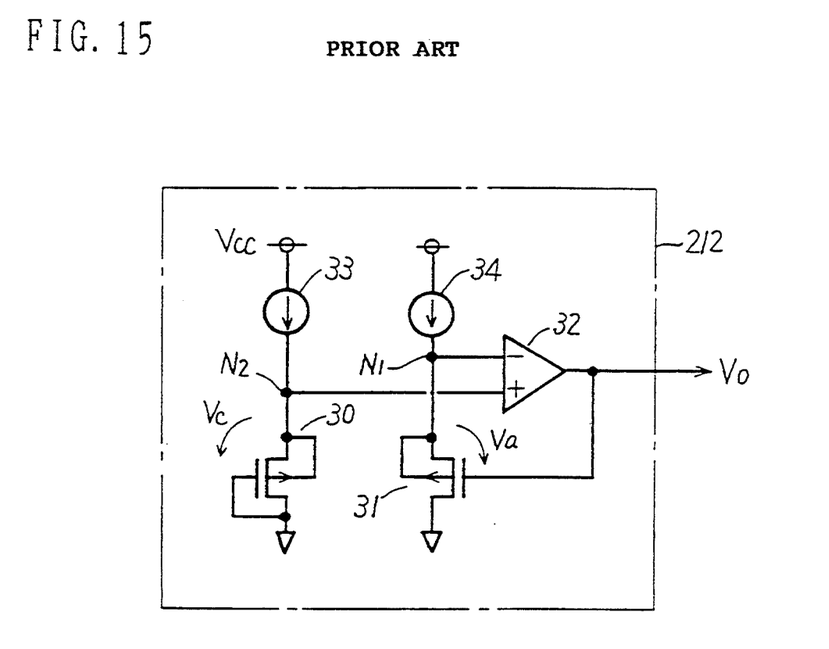
FIG. 15 is a schematic diagram of another example of a reference voltage generating circuit in the prior art.

FIG. 15 is a schematic diagram showing another example of the reference voltage generating circuit in the prior art. A reference voltage generating circuit 212 shown in FIG. 15 is disclosed in a paper entitled "A TUNABLE CMOS-DRAM VOLTAGE LIMITER WITH STABILIZED FEEDBACK AMPLIFIER" (M. Horiguchi et al., 1990 Symposium on VLSI Circuits, pp 75-76; IEEE).

Referring to FIG. 15, the reference voltage generating circuit 212 includes two constant current sources 33 and 34, diode-connected PMOS transistors 30 and 31 and a differential amplifier 32. Transistor 30 has its gate and drain connected together. The constant current source 33 and the transistor 30 have a common connection node N2 which is connected to a noninverted node of the differential amplifier 32. The constant current source 34 and the transistor 31 have a common connection node N1 which is connected to an inverted node of the differential amplifier 32. An output node of the differential amplifier 32 is connected to the gate of transistor 31.

The transistor 31 has such gate-source voltage and drain current characteristics as represented by characteristics A in FIG. 16. Transistor 30 has such gate-source voltage and drain current characteristics as represented by characteristics B in FIG. 16. The characteristics B are represented by line LB30 indicative of the characteristics at the ambient temperature of 30° C. and line LB100 indicative of the characteristics at the ambient temperature of 100° C.

The reference voltage generating circuit 212 shown in FIG. 15 operates as follows. When the potential of node N1 is higher than that of node N2, the differential amplifier 32 supplies the lower output voltage. Therefore, the transistor 31 is turned on with a lower ON-resistance, and thus the potential of node N1 reduces. When the potential of node N2 is higher than that of node N1, the differential amplifier 32 supplies the higher output voltage. Therefore, the transistor 31 is turned on with a higher ON-resistance, and thus the potential of node N1 rises. As a result, potential at each of nodes N1 and N2 is always kept constant.

It is assumed that the transistors 30 and 31 receive a drain current of $10^{-7}$ (A/$\mu$m) from the constant current sources 33 and 34, respectively. At the ambient temperature of 30° C., the potential of node N1 has a value of $Vo + |Va|$ in accordance with the characteristics in FIG. 16, and the potential of node N2 has a value of $|Vc|$.

As described above, the potentials of nodes N1 and N2 are controlled to be equal to each other, so that relationship of $|Vc| = Vo + |Va|$ reference voltage generating circuit 212 supplies the output voltage Vo of $|Vc| - |Va|$ at the ambient temperature of 30° C. Similarly, the output voltage Vo at the ambient temperature of 100° C. is $Vo = |Vd| - |Vb|$ in accordance with the characteristics in FIG. 16.

As can be seen from FIG. 16, the values of $|Vc| - |Va|$ and $|Vd| - |Vb|$ are nearly equal to each other. Therefore, the output voltage Vo is maintained substantially at a constant value regardless of the change of the ambient temperature.

The reference voltage generating circuit 212 shown in FIG. 15 requires the PMOS transistors 31 and 30 having the characteristics A and B shown in FIG. 16. In order to manufacture the PMOS transistors 30 and 31 having the different characteristics A and B, it is necessary to increase a quantity of n-type impurity doped in a channel region of the transistor 30 in the manufacturing steps of the semiconductor device. Therefore, as compared with a case that the circuit is formed of MOS transistors having common characteristics only, the number of steps for manufacturing the reference voltage generating circuit 212 increases, and thus the manufacturing cost of the semiconductor device increases.

FIG. 17 shows simplified manufacturing steps for MOS transistors having channel regions of different impurity concentrations. First, in a step shown in FIG. 17(a), a field oxide film 301 for separating elements is formed on a semiconductor substrate 300, and then n-type impurities at a low concentration are implanted thereinto. At a next step shown in FIG. 17(b), a resist 302 is formed on one of the implanted regions, and n-type impurities at a higher concentration are further implanted into the other implanted region. Thereby, the p-type impurity regions 303 and 304 having different impurity concentrations are formed.

Figure 17A:
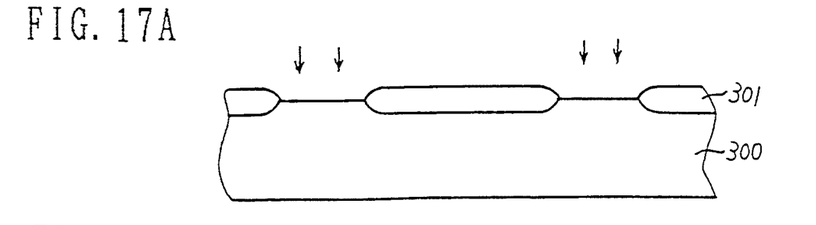
FIGS. 17(a)–(d) show simplified steps for manufacturing a MOS transistor having channel regions of different impurity concentrations.
Figure 17B:
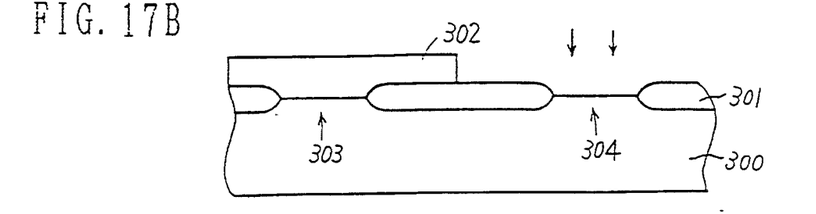
Figure 17C:
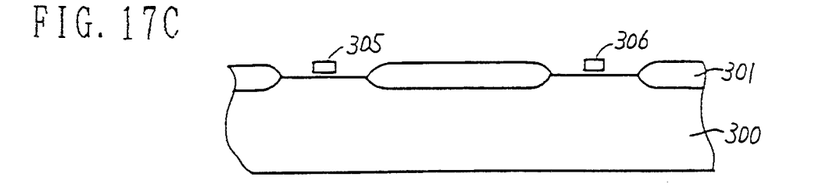
Figure 17D:
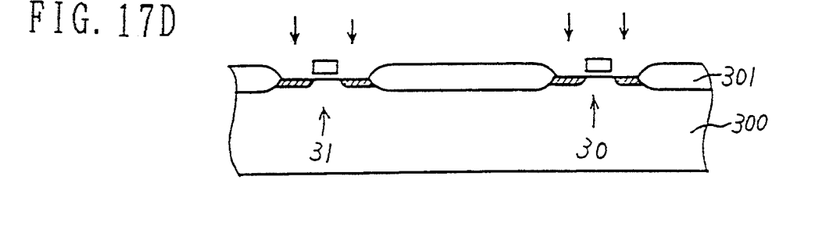

In the step in FIG. 17(c), gates 305 and 306 for the MOS transistors are formed with polysilicon. In a step in FIG. 17(d), n-type impurities are implanted for forming sources and drains of MOS transistors. As a result, the transistor 31 having the characteristics A shown in FIG. 16 and the transistor 30 having the characteristics B are formed on the semiconductor substrate 300.

As can be seen from FIGS. 17(a)-(d), additional steps are required for forming MOS transistors 30 and 31 having the different characteristics A and B, respectively.

Figure 18:
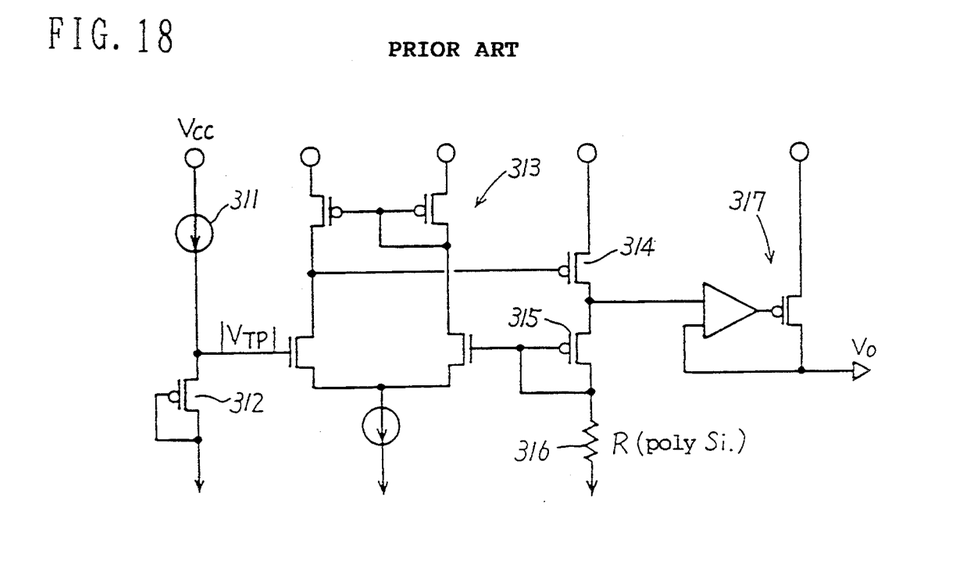
FIG. 18 is a schematic diagram showing still another example of a reference voltage generating circuit in the prior art.

FIG. 18 is a circuit diagram showing still another example of a reference voltage generating circuit in the prior art. A reference voltage generating circuit shown in FIG. 18 is disclosed in a paper entitled "Temperature-Compensation Circuit Techniques for High-Density CMOS DRAMs" (D. S. Min et al., pp 125–126).

Referring to FIG. 18, a reference voltage generating circuit includes a current source 311, a diode-connected PMOS transistor 312, a differential amplifier 313, PMOS transistors 314 and 315, a resistor 316 formed of polysilicon and a driver 317 of a voltage follower type. The current source 311 and PMOS transistor 312 form a reference voltage generator.

The reference voltage generating circuit shown in FIG. 18 can be applied as an internal voltage converter (IVC) in the DRAM. The reference voltage generating circuit shown in FIG. 18 uses the resistor 316 formed of polysilicon for compensating the influence on the output voltage Vo by the change of the ambient temperature. It is noted that the polysilicon resistor 316 is useful for the temperature compensation, but it is difficult to form the polysilicon resistor having a stable resistance in the manufacturing steps of the semiconductor device. Specifically, the resistance of polysilicon resistor 316 often changes in accordance with the manufacturing conditions, and thus the output voltage Vo is liable to change.

SUMMARY OF THE INVENTION

An object of the invention is to provide a reference voltage generating circuit temperature-compensated without an additional manufacturing step.

Another object of the invention is to prevent influence on an output voltage by fluctuation of a resistance, which may be caused in a manufacturing step, in a temperature-compensated reference voltage generating circuit.

Still another object of the invention is to provide an internal voltage converting circuit which is temperature-compensated without an additional manufacturing step in a semiconductor device.

Yet another object of the invention is to provide an internal voltage converting circuit which is temperature-compensated without an additional manufacturing step in a semiconductor memory device.

A reference voltage generating circuit in accordance with the invention includes a constant current source, a first field effect transistor having its gate and drain connected together and receiving an output current from the constant current source as its drain current, an amplifier circuit connected to a common connection node of the constant current source and the first field effect transistor, and a negative feedback circuit applying a negative feedback signal to the amplifier circuit. The negative feedback circuit includes a resistor and a second field effect transistor connected in series between an output node of the amplifier circuit and a supply potential. The second field effect transistor has its gate and drain connected together. The resistor and the second field effect transistor have a common connection node through which a negative feedback signal is applied to the amplifier circuit. The first and second field effect transistors have gate-source voltage and drain current characteristics which are shifted as an ambient temperature rises. Drain currents of the first and second field effect transistors are determined to minimize temperature dependency of an output voltage of the amplifier circuit.

In operation, the drain current of the second field effect transistor is determined, in connection with the drain current of the first field effect transistor, to minimize the temperature dependency of the output voltage of the amplifier circuit. The first and second field effect transistors have the same gate-source voltage and drain current characteristics, and thus do not require different characteristics. Therefore, an additional manufacturing step is not required. In addition thereto, a resistor element such as polysilicon resistor having special characteristics for the temperature compensation is not used. Therefore, an influence on the output voltage, which may be caused by fluctuation of the resistance due to the variation of the manufacturing conditions, is prevented.

A semiconductor device in accordance with another aspect of the invention includes a semiconductor substrate, an internal voltage converting circuit formed on the semiconductor substrate for converting an externally applied external supply voltage into an internal supply voltage, and an internal circuit formed on the semiconductor substrate for receiving the converted internal supply voltage. The internal voltage converting circuit includes a constant current source receiving the external supply voltage, a first field effect transistor having its gate and drain connected together and receiving an output current from the constant current source as its drain current, an amplifier receiving the external supply voltage and being connected to a common connection node of the constant current source and the first field effect transistor, and a negative feedback circuit applying a negative feedback signal to the amplifier. The negative feedback circuit includes a resistor and a second field effect transistor connected in series between an output node of the amplifier and the ground. The second field effect transistor has its gate and drain connected together. The negative feedback signal is applied to the amplifier through a common connection node of the resistor and the second field effect transistor. The first and second field effect transistors have gate-source voltage and drain current characteristics which are shifted as an ambient temperature rises. The drain currents of the first and second field effect transistors are determined to minimize a temperature dependency of the output voltage of the amplifier.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
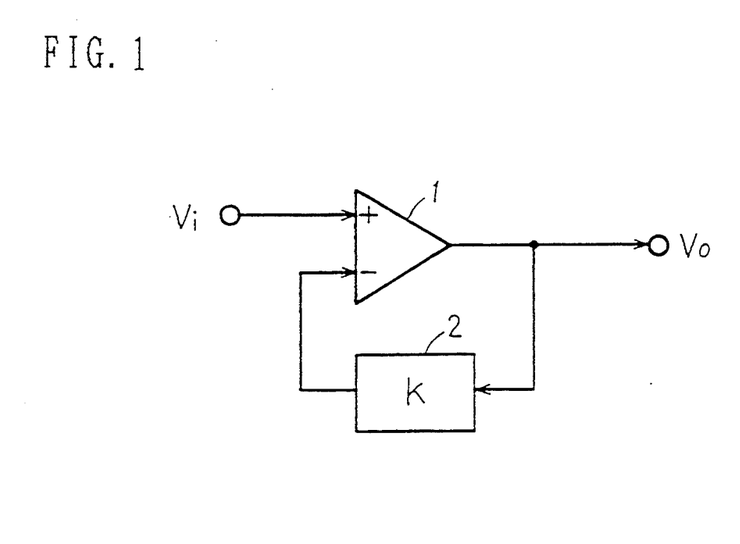
FIG. 1 is a block diagram of a negative feedback amplifier showing a principle of the invention.

Referring to FIG. 1, a negative feedback amplifier includes a differential amplifier 1 and a negative feedback circuit 2. The differential amplifier 1 receives an input voltage Vi through a noninverted input node. The negative feedback circuit 2 receives an output voltage Vo and applies a feedback voltage of k·Vo (k indicating a feedback amount) to an inverted input node of the differential amplifier 1. Therefore, following expressions can be established in the negative feedback amplifier shown in FIG. 1.

$$Vo = A \cdot (Vi - k \cdot Vo) \quad (1)$$

therefore, $$Vo = Vi/(k + 1/A) \quad (2)$$

where "A" indicates a gain of the differential amplifier 1. When the gain A is sufficiently large, the following expression is obtained from the expression (2).

$$Vo = Vi/k \quad (3)$$

Therefore, it can be understood that the feedback amount k should be gradually reduced as the ambient temperature rises in order to compensate gradual reduction of the output voltage Vo caused as the ambient temperature rises.

Figure 2:
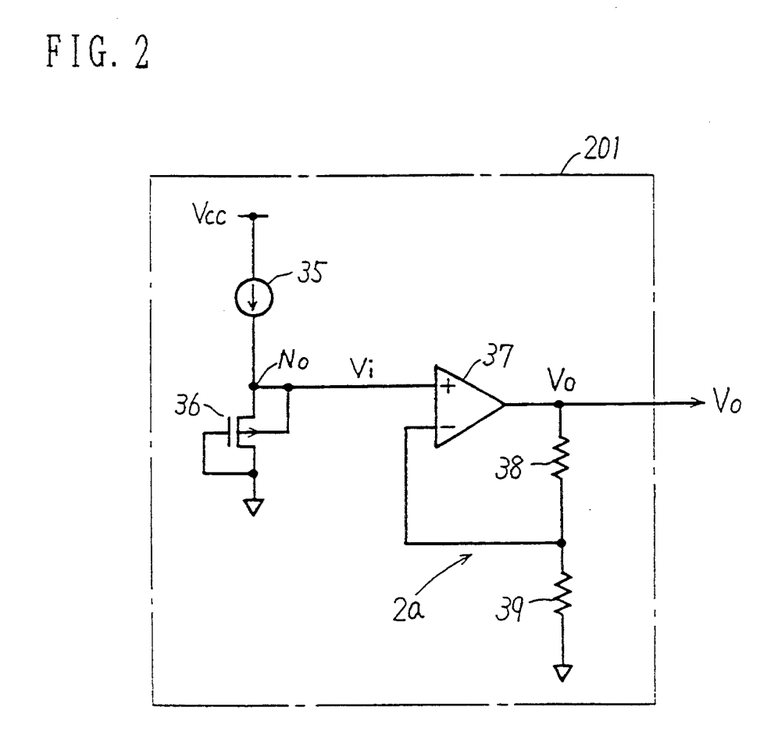
FIG. 2 is a circuit diagram of a reference voltage generating circuit showing a background of the invention.

FIG. 2 is a schematic diagram of a reference voltage generating circuit showing the background of the invention. Referring to FIG. 2, a reference voltage generating circuit 201 includes a constant current source 35 and a diode-connected PMOS transistor 36 which are connected in series between a supply potential Vcc and the ground, a differential amplifier 37 and a negative feedback circuit 2a. The transistor 36 has its gate and drain connected together. The constant current source 35 and the transistor 36 have a common connection node No connected to a noninverted input of the differential amplifier 37.

A negative feedback circuit 2a includes resistors 38 and 39 connected in series between an output node of the differential amplifier 37 and the ground. The resistors 38 and 39 have a common connection node connected to an inverted input node of the differential amplifier 37, whereby the negative feedback circuit 2a is formed. The resistor 38 is formed of a p-type diffusion layer formed in the semiconductor substrate. The resistor 39 is formed of polysilicon on the semiconductor substrate.

Assuming that the resistors 38 and 39 have resistances of R1 and R2, respectively, the output voltage Vo can be obtained from the following expression.

$$Vo = Vi/k = (1 + R1/R2) \cdot Vi \quad (4)$$

For example, the resistance R1 of the p-type diffusion resistor 38 is 63.9 Ω/□ at the ambient temperature 30° C. and is 70.3 Ω/□ at the ambient temperature 100° C.

The resistance R2 of the polysilicon resistor 39 is 47.9 $\Omega/\square$ at the ambient temperature of 30° C. and is 49.6 $\Omega/\square$ at the ambient temperature of 100° C. Therefore, a change ratio VR of the output voltage Vo between the ambient temperatures of 30° C. and 100° C. can be obtained by the following expression.

$$VR = Vi_{100} \times (1 + 70.3/49.6)/\{Vi_{30} \times (1 + 63.9/47.9)\} \quad (5)$$
$$= 1.036 \times Vi_{100}/Vi_{30}$$

where $Vi_{30}$ indicates the value of input voltage Vi at the ambient temperature of 30° C., and $Vi_{100}$ indicates the value of input voltage Vi at the ambient temperature of 100° C.

Accordingly, if the input voltages $Vi_{30}$ and $Vi_{100}$ satisfying the following expression (6) are applied, the output voltage Vo is not affected by the change of the ambient temperature.

$$Vi_{30}/Vi_{100}=1.036 \quad (6)$$

The drain current of the transistor 36 is set at $2 \times 10^{-6}$ (A) so that the constant voltage circuit formed of the constant current source 35 and transistor 36 supplies the voltages $Vi_{30}$ and $Vi_{100}$ satisfying the expression (6). In other words, the constant current source 35 is employed so that the drain current of the transistor 36 may be $2 \times 10^{-6}$ (A).

Accordingly, assuming that the transistor 36 has the characteristics A shown in FIG. 16, the relationship of $|Va'|=1.14$ and $|Vb'|=1.10$ can be obtained, as shown by lines $LA_{30}$ and $LA_{100}$. Therefore, the relationship of $Vi_{30}/Vi_{100}=|Va'|/|Vb'|=1.14/1.10=1.036$ can be obtained, whereby the output voltage Vo is substantially not affected by the change of the ambient temperature.

The reference voltage generating circuit 201 shown in FIG. 2, however, uses the p-type diffusion resistor 38 and the polysilicon resistor 39 for the temperature compensation, and thus has a disadvantage similar to that of the reference voltage generating circuit shown in FIG. 18. Specifically, since the resistances R1 and R2 of resistors 38 and 39 may be different in respective lots of semiconductor wafers due to the variation of the manufacturing conditions, the following disadvantage may be caused.

As can be seen from the foregoing expression (4), the output voltage Vo changes in accordance with the resistor ratio R1/R2 (R1 and R2 indicating the resistances of resistors 38 and 39, respectively). Therefore, the value of R1/R2 is not stable, and thus the change of the output voltage Vo supplied from the reference voltage generating circuit 201 is inevitable. In order to avoid this disadvantage, the reference voltage generating circuit 201 shown in FIG. 2 is improved as follows.

Figure 3:
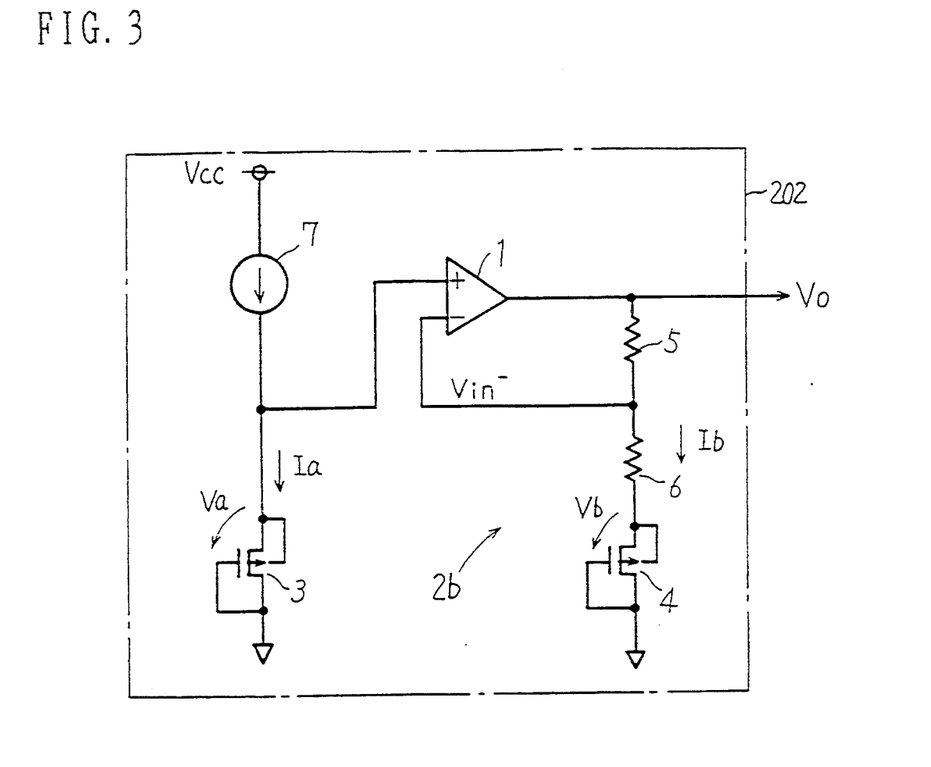
FIG. 3 is a circuit diagram of a reference voltage generating circuit of an embodiment of the invention.

FIG. 3 is a schematic diagram showing a reference voltage generating circuit of an embodiment of the invention. Referring to FIG. 3, a reference voltage generating circuit 202 includes a constant current source 7 and a PMOS transistor 3 which form a constant voltage circuit, and a differential amplifier 1, as well as resistors 5 and 6 and a PMOS transistor 4 which form a negative feedback circuit 2b. Each of the PMOS transistors 3 and 4 has characteristics C shown in FIG. 5.

Figure 5:
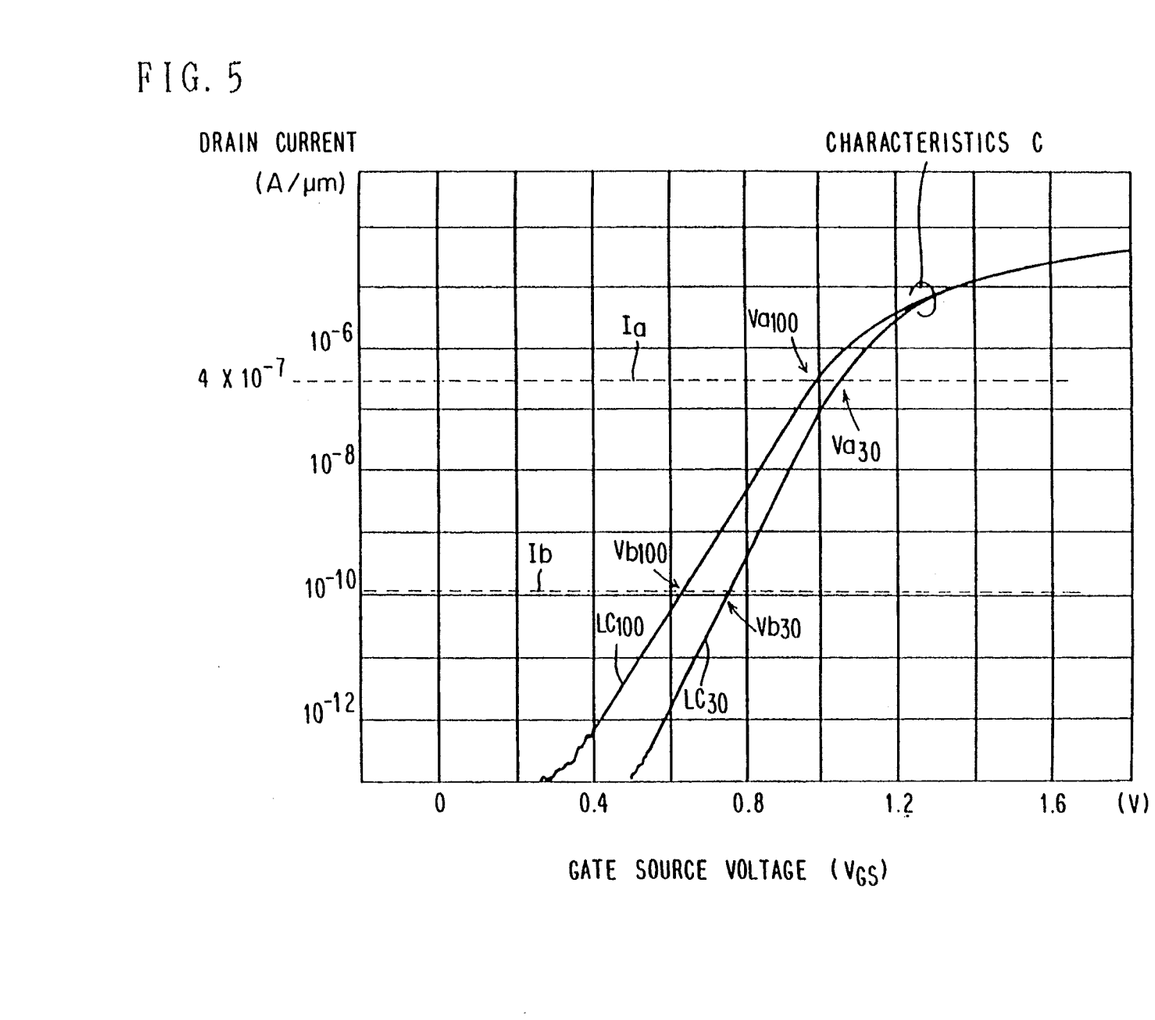
FIG. 5 is a characteristic diagram showing gate-source voltage and drain current characteristics of a PMOS transistor shown in FIG. 3.

FIG. 5 shows gate-source voltage and drain current characteristics of the PMOS transistors 3 and 4 in FIG. 3. Referring to FIG. 5, line $LC_{30}$ shows the characteristics at the ambient temperature of 30° C. Line $LC_{100}$ shows the characteristics at the ambient temperature of 100° C. In FIG. 5, the abscissa indicates the voltage $V_{GS}$ across the gate and source, and the ordinate indicates the drain current (A/$\mu$m) per channel width of 1 $\mu$m.

In the diagram of FIG. 3, the voltage Vin of the negative input terminal of the differential amplifier 1 is $Vb+(Vo+Vb)/2$ when the resistors have the same resistance, thus the feedback amount k ($=$Vin/Vo) of the negative feedback circuit 2b is obtained from the following expression.

$$K = \{Vb + (Vo - Vb)/2)\}/Vo \quad (7)$$
$$= (Vo + Vb)/2 \cdot Vo$$

where Vb indicates the voltage ($V_{GS}$) across the gate and source of transistor 4. Therefore, the output voltage Vo of reference voltage generating circuit 202 shown in FIG. 3 can be obtained by the following expression.

$$Vo=Va/k=2 \cdot Vo \cdot Va/(Vo+Vb)$$

therefore, $$Vo=2 \cdot Va-Vb \quad (8)$$

where Va indicates the voltage ($V_{GS}$) across the gate and source of transistor 3. In addition thereto, it is assumed that the relationship between the voltages Va and Vb and the ambient temperature T° C. is represented by the following expressions.

$$Va=Va_{30}-m \cdot (T-30) \quad (9)$$

$$Vb=Vb_{30}-n \cdot (T-30) \quad (10)$$

Therefore, the following expression can be obtained by applying the expressions (9) and (10) to the expression (8).

$$Vo = 2 \cdot Va - Vb \quad (11)$$
$$= 2 \cdot Va_{30} - Vb_{30} - (2 \cdot m - n) \times (T - 30)$$

where m and n indicate temperature coefficients of the gate-source voltages Va and Vb, respectively.

Therefore, by employing the design in which the drain current of transistor 3 is $4 \times 10^{-7}$ (A) per channel width of 1 $\mu$m and the drain current of transistor 4 is $4 \times 10^{-10}$ (A) per channel width of 1 $\mu$m, the temperature coefficients m and n can be obtained on the basis of the characteristic diagram of FIG. 5.

$$m = (Va_{30} - Va_{100})/(100 - 30) \quad (12)$$
$$= (1.057 - 0.990)/(100 - 30)$$
$$= 0.957 \times 10^{-3}(V/°C.)$$

$$n = (Vb_{30} - Vb_{100})/(100 - 30) \quad (13)$$
$$= (0.762 - 0.629)/(100 - 30)$$
$$= 1.9 \times 10^{-3} (V/°C.)$$

As a result, the following expression is obtained.

$$2 \cdot m - n = 1.4 \times 10^{-5}(V/° C.) \quad (13A)$$

Therefore, value of 2·m−n is sufficiently small, and thus the output voltage Vo obtained from the expression (11) is not affected by the change of the ambient temperature T.

Figure 6:
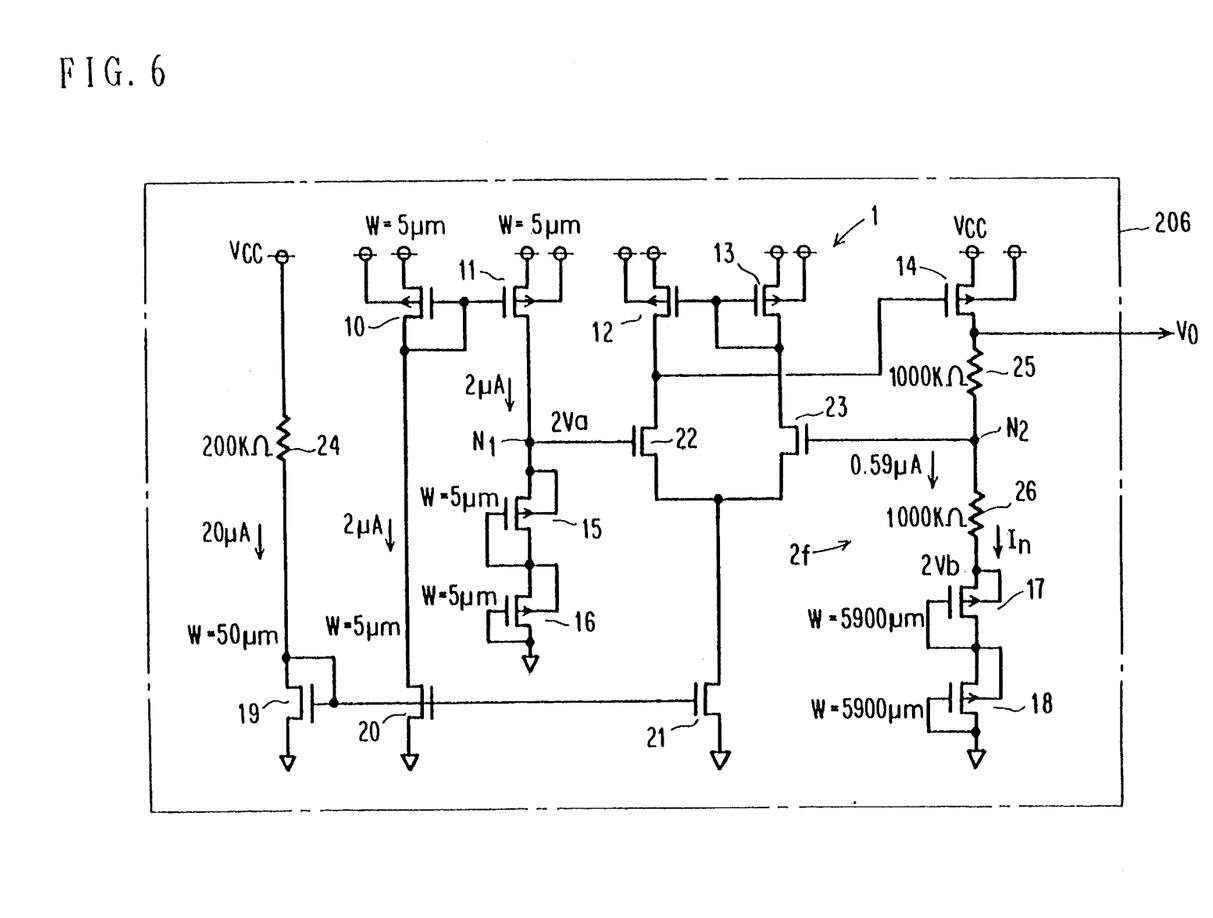
FIG. 6 is a specific circuit diagram of a reference voltage generating circuit shown in FIG. 3.

As compared with the reference voltage generating circuit 201 shown in FIG. 2, the output voltage Vo of reference voltage generating circuit 202 shown in FIG. 3 does not depend on the each resistance of resistors 5 and 6 but depend on the ratio of the resistances, as can be seen from the expression (11). Thus, the stable output voltage Vo can be obtained even if the resistances resistors 5 and 6 are different in the respective lots due to the variation of the manufacturing conditions of the semiconductor devices. For example, if the resistances of resistors 5 and 6 change about 20%, the drain current density of transistor 4 changes about 20%. However, as can be seen from the characteristic diagram of FIG. 5, the gate-source voltage Va of transistor 3 scarcely changes, so that the stable output voltage Vo can be obtained. FIG. 6 is a schematic diagram specifically showing the reference voltage generating circuit in FIG. 3. Referring to FIG. 6, a reference voltage generating circuit 206 includes PMOS transistors 10–18, NMOS transistors 19–23 and resistors 24–26. The differential amplifier 1 is formed of transistors 12, 13, 14, 22 and 23. In order to operate the differential amplifier 1 at the preferable sensitivity, two transistors 15 and 16, each being diode connected, are connected together in series. For the same purpose, two transistors 17 and 18, each being diode connected, are connected together in series.

Similarly to the circuit shown in FIG. 3, two input nodes N1 and N2 of the differential amplifier 1 are controlled to have the equal potential, so that the following expression is established.

$$2 \cdot Va = (Vo + 2 \cdot Vb)/2$$

$$\therefore Vo = 4 \cdot Va - 2 \cdot Vb \quad (14)$$

From the characteristic diagram of FIG. 5, the relationship of $Va_{30} = 1.057$ and $Vb_{30} = 0.762$ is obtained, so that $Vo = 2.7$ (V) is obtained from the expression (14).

Accordingly, if it is assumed that the resistance of resistor 26 is 100 kΩ the current I17 flowing through the transistors 17 and 18 is obtained from the following expression.

$$\begin{aligned}
I17 &= (Vo - 2 \cdot Vb)/2 \times 1000 \times 10^3 \\
&= (2.7 - 2 \times 0.762)/(2000 \times 10^3) \\
&= 0.59 \; (\mu A)
\end{aligned} \quad (15)$$

Therefore, the channel widths of transistors 17 and 18 are set at 5900 μm in order to set the drain current densities of transistors 17 and 18 at $1.0 \times 10^{-10}$ (A/μm).

Meanwhile, if it is assumed that the current flowing through the transistors 15 and 16 are 2 μA, the channel widths of transistors 15 and 16 are set at 5 μm in order to set the drain current densities of transistors 15 and 16 at $4 \times 10^{-7}$ (A/μm).

Owing to the operation of the two current mirror circuits formed of the transistors 10, 11, 19 and 20, the current flowing through the transistor 19 is ten times as large as that flowing through the transistor 11, i.e., it is 20 μA. Therefore, if it is assumed that the supply voltage is 5 V and the drain voltage of transistor 19 is 1 V, the resistance of resistor 24 is set at 200 KΩ.

Figure 7:
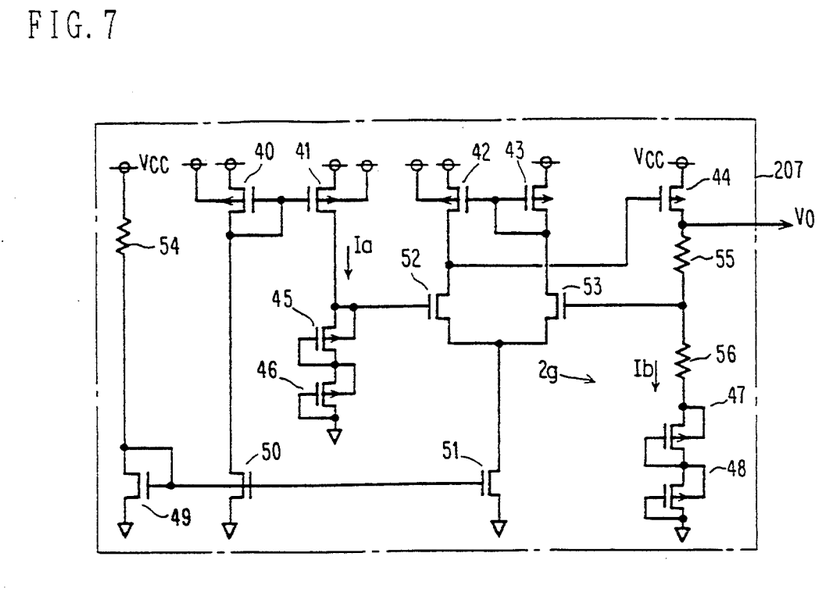
FIG. 7 is a circuit diagram of a reference voltage generating circuit of still another embodiment of the invention.

FIG. 7 is a schematic diagram showing the reference voltage generating circuit of still another embodiment of the invention. The reference voltage generating circuit 206 shown in FIG. 6 utilizes only the fact that the temperature dependency of the gate-source voltage differs in the transistors having the different drain current densities. However, the reference voltage generating circuit 207 shown in FIG. 7 additionally utilizes temperature dependencies of the diffusion resistor and polysilicon resistor. Referring to FIG. 7, the reference voltage generating circuit 207 includes PMOS transistors 40–48, NMOS transistors 49–53 and resistors 54–56. As a feature of the reference voltage generating circuit 207 shown in FIG. 7 which is different from the circuit 206 shown in FIG. 6, the resistors 55 and 56 used therein are made from material having a temperature coefficient higher than that of the resistor 54.

The output voltage Vo of the reference voltage generating circuit 207 is obtained from $Vo = 4 \cdot Va - 2 \cdot Vb$, similarly to the circuit 206 shown in FIG. 6. It is assumed that the bias currents of transistors 45 and 46 at the ambient temperatures of 30° C. and 100° C. are $Ia_{30}$ and $Ia_{100}$. It is also assumed that the bias currents of transistors 47 and 48 at the ambient temperatures of 30° C. and 100° C. are $Ib_{30}$ and $Ib_{100}$.

The resistor 54 is made from polysilicon. The resistors 55 and 56 are formed of p+ diffusion resistors. Since the p+ diffusion layers forming the resistors 55 and 56 have the temperature coefficients higher than that of the polysilicon forming the resistor 54, the current Ib flowing through the transistors 47 and 48 changes more largely than the current Ia when the ambient temperature changes.

Figure 8:
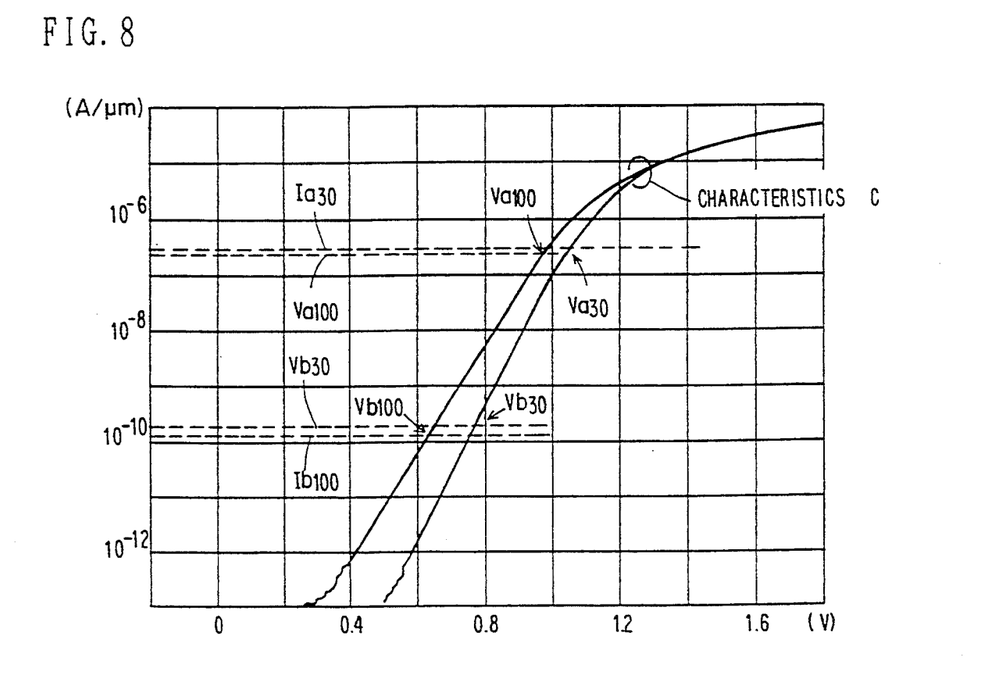
FIG. 8 is a characteristic diagram showing gate-source voltage and drain current characteristics of a PMOS transistor shown in FIG. 7.

Referring to the gate-source voltage and drain current characteristics shown in FIG. 8, when the ambient temperature changes, the difference of the voltages Vb ($=Vb_{30}-Vb_{100}$) is larger than the difference of the voltages Va ($=Va_{30}-Va_{100}$), so that the ratio of currents Ia and Ib can be small, as compared with the case that the resistors 54, 55 and 56 are formed of the same resistor material. Therefore, the transistors 47 and 48 can be designed to have the channel widths smaller than those of the transistors 17 and 18 shown in FIG. 6, and thus the reference voltage generating circuit 207 can be integrated on the semiconductor substrate at a higher degree.

Figure 4:
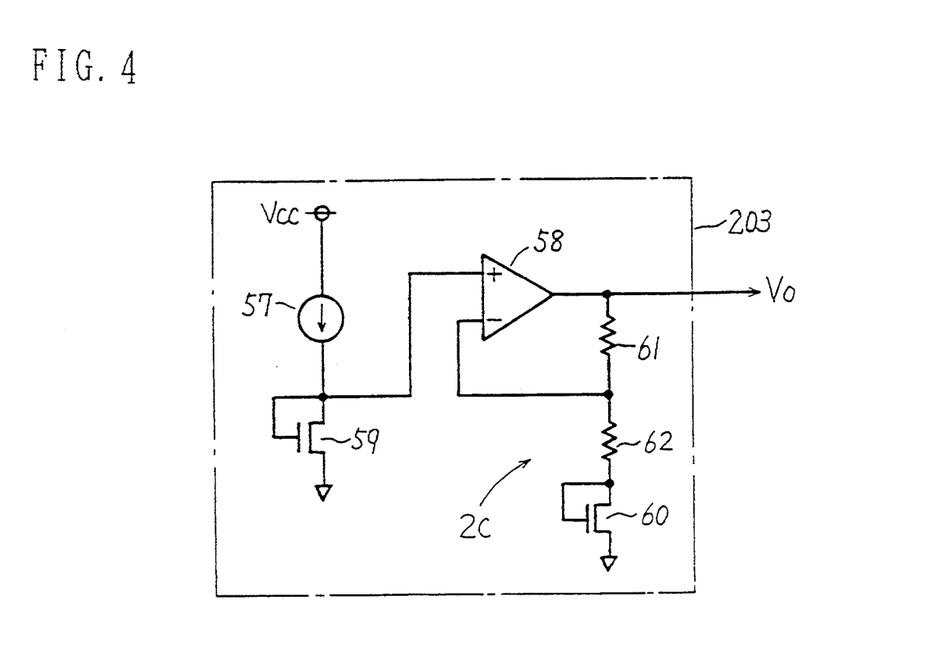
FIG. 4 is a circuit diagram of a reference voltage generating circuit of another embodiment of the invention.

FIG. 4 is a schematic diagram of the reference voltage generating circuit showing still another embodiment of the invention. As compared with the reference voltage generating circuit 202 shown in FIG. 3, the reference voltage generating circuit 203 shown in FIG. 4 uses NMOS transistors 59 and 60 instead of the PMOS transistors 3 and 4. The reference voltage generating circuit 203 includes a constant current source 57, a differential amplifier 58, the NMOS transistors 59 and 60 each of which is diode-connected, and resistors 61 and 62. A negative feedback circuit 2c is formed of the resistors 61 and 62 and the transistor 60.

Figure 9:
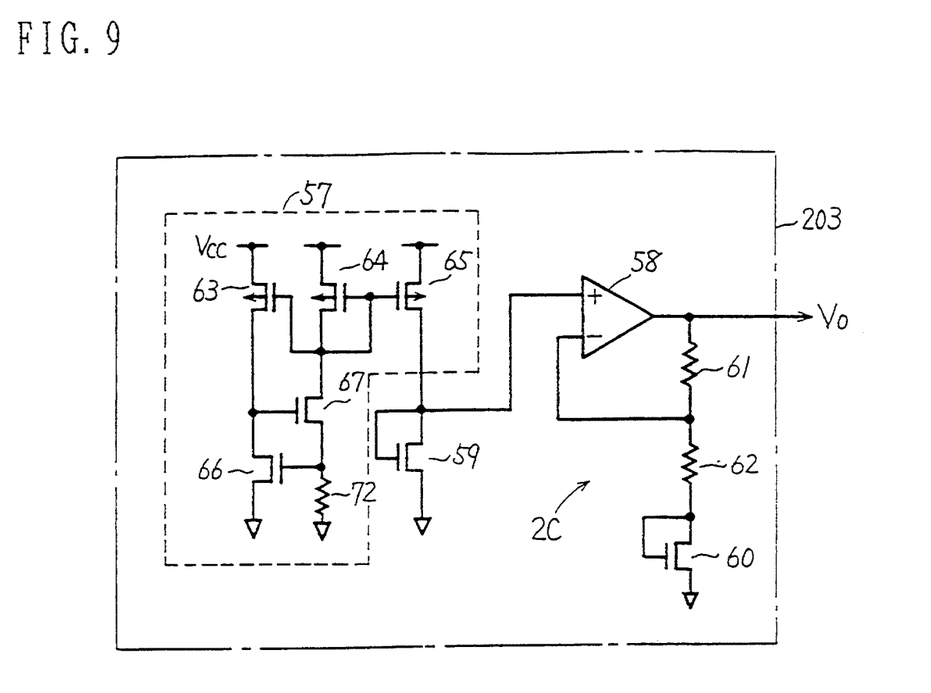
FIG. 9 is a circuit diagram showing an example of a constant current source shown in FIG. 4.

FIG. 9 is a circuit diagram showing an example of the constant current source 57 shown in FIG. 4. Referring to FIG. 9, the constant current source circuit 57 includes PMOS transistors 63, 64 and 65, NMOS transistors 66 and 67, and a resistor 72. Assuming that the transistors 64 and 65 which form a current mirror circuit have the same channel width, a current of Vt/R flows through the transistor 59, wherein Vt indicates a threshold voltage of the transistor 66, and R indicates the resistance of the resistor 72.

The resistors 61 and 62 are formed of p+ diffusion resistors, and the resistor 72 is formed of polysilicon resistor, whereby the temperature compensation can be achieved, similarly to the circuit 207 shown in FIG. 7, by the transistor 60 having a narrower channel width.

Figure 10:
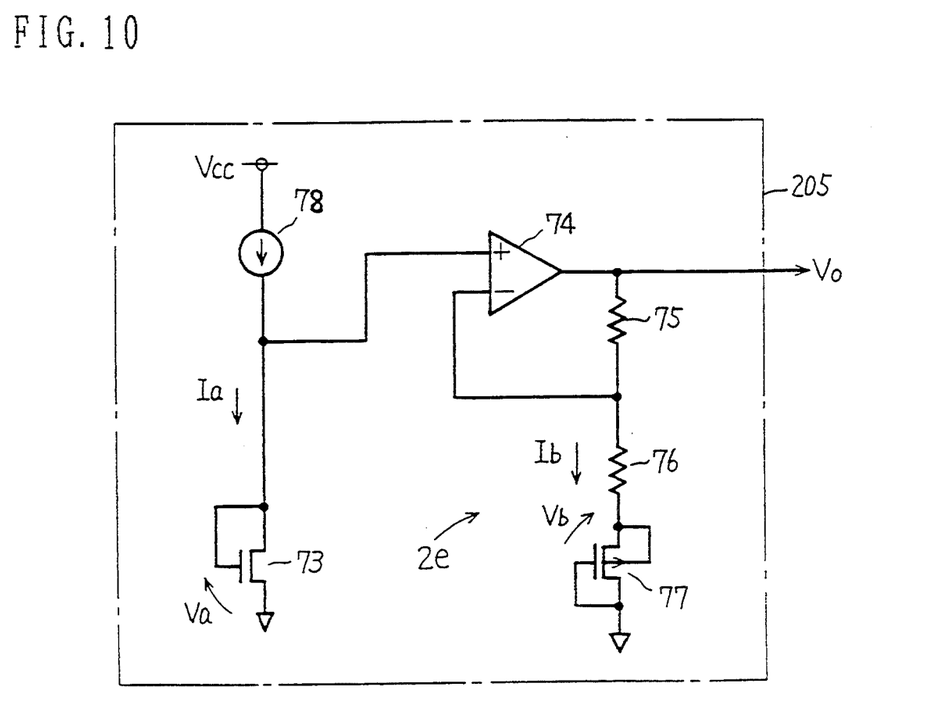
FIG. 10 is a circuit diagram of a reference voltage generating circuit of yet another embodiment of the invention.

FIG. 10 is a circuit diagram of the reference voltage generating circuit showing yet another embodiment of the invention. Referring to FIG. 10, the reference voltage generating circuit 205 includes a constant current source 78, diode-connected NMOS and PMOS transistor 73 and 77, respectively a differential amplifier 74 and resistors 75 and 76. The output voltage Vo is obtained from Vo=2·Va−Vb, similarly to the reference voltage generating circuit 202 shown in FIG. 3.

If the drain current Ia per channel width of 1 μm flows through the transistor 73, the gate-source voltage Va can be obtained from the following expression.

$$Va = Va_{30} - u \cdot (T-30) \quad (16)$$

If the drain current Ib per channel width of 1 μm flows through the transistor 77, the gate-source voltage Vb can be obtained from the following expression.

$$Vb = Vb_{30} - v \cdot (T-30) \quad (17)$$

Therefore, the following expression can be obtained by applying the expressions (16) and (17) to the expression Vo=2·Va−Vb.

$$Vo = 2 \cdot Va_{30} - Vb_{30} - (2 \cdot u - v) \cdot (T-30) \quad (18)$$

Figure 11:
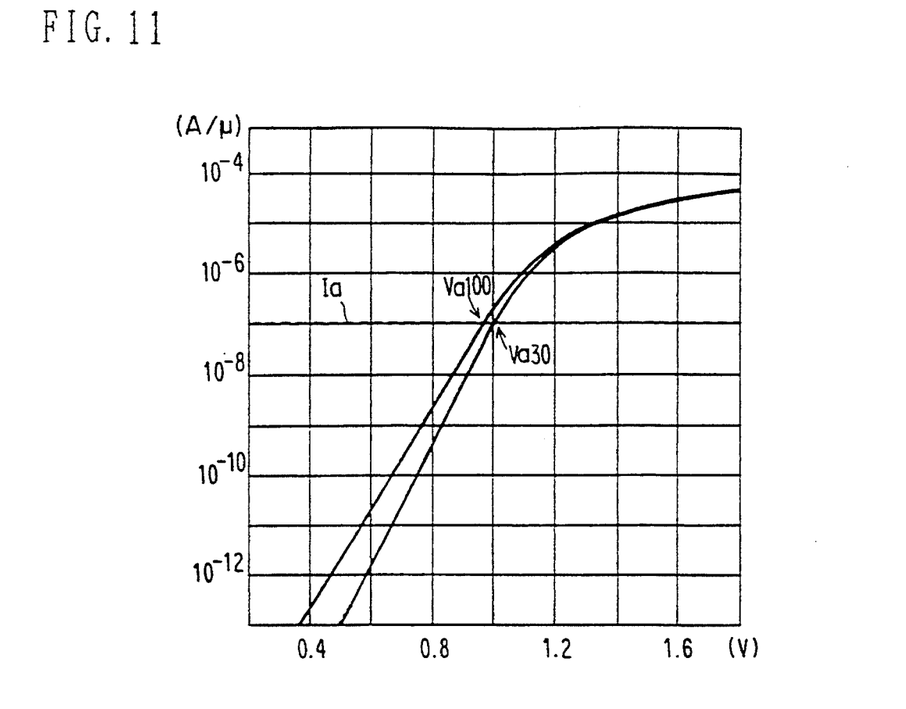
FIG. 11 is a characteristic diagram showing gate-source voltage and drain current characteristics of an NMOS transistor shown in FIG. 10.
Figure 12:
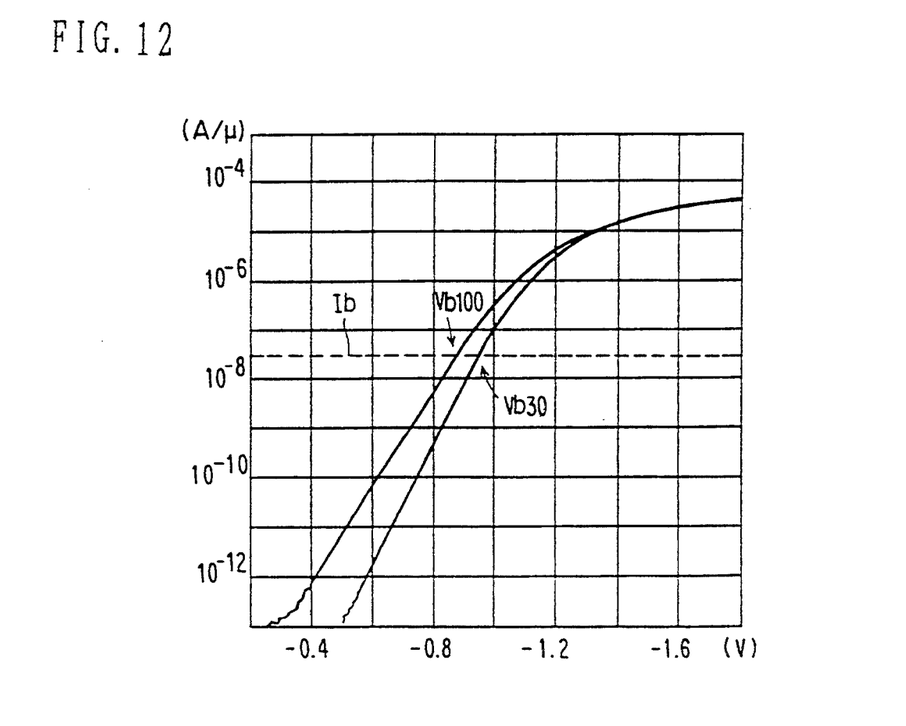
FIG. 12 is a characteristic diagram showing gate-source voltage and drain current characteristics of a PMOS transistor shown in FIG. 10.

FIGS. 11 and 12 are characteristic diagrams showing the gate-source voltage and drain current characteristics of NMOS transistor 73 and PMOS transistor 77 shown in FIG. 10, respectively. As can be seen from the comparison of the characteristic diagrams of FIGS. 11 and 12, the PMOS transistor 77 has a larger temperature dependency than the NMOS transistor 73. Therefore, the relationship of 2·u=v can be obtained with the ratio Ia/Ib of a smaller value. Therefore, the channel width of transistor 77 can be set small, so that the reference voltage generating circuit 205 can be integrated on the semiconductor substrate at a higher degree.

Figure 13:
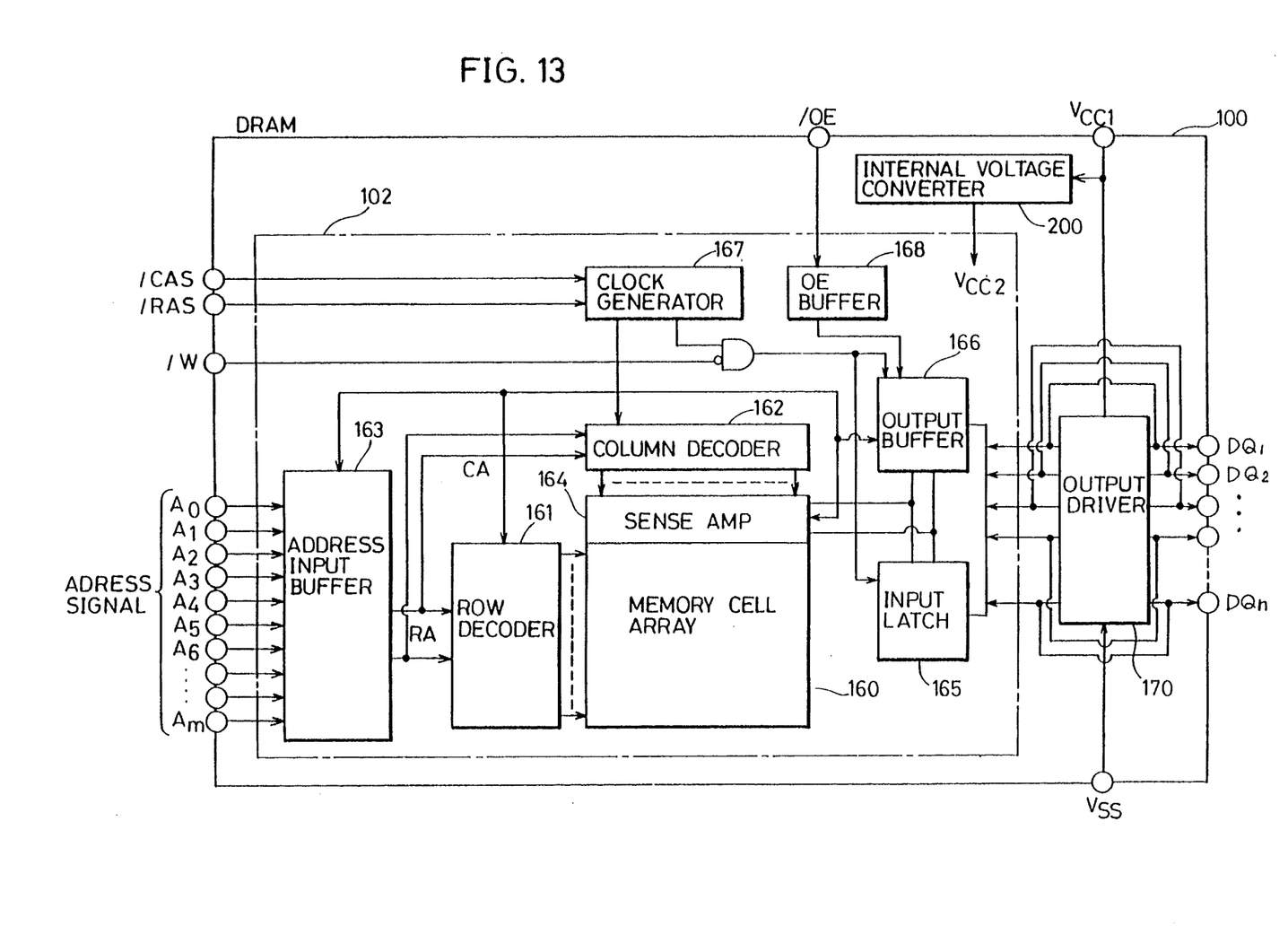
FIG. 13 is a block diagram of a DRAM to which a reference voltage generating circuit of an embodiment of the invention can be applied.

FIG. 13 is a block diagram of a DRAM which can utilize the reference voltage generating circuit of the foregoing embodiments. Referring to FIG. 13, a DRAM 100 includes an internal voltage converter 200 which is formed of the reference voltage generating circuit in one of the foregoing embodiments described before. The internal voltage converter 200 receives an externally applied supply voltage Vcc1 (e.g., of 5 V), and supplies the converted reference voltage Vo as an internal supply voltage Vcc2 (e.g., of 4 V). An output driver circuit 170 receives the externally applied supply voltage Vcc1. Other internal circuit 102 receives the internal supply voltage Vcc2 supplied from the internal voltage converter 200. Internal circuit 102 includes a memory cell array 160, row and column decoders 161 and 162, respectively, an address input buffer 163, a sense amplifier 164, an input latch circuit 165, an output buffer 166, a clock signal generator 167 and an OE buffer 168. Therefore, each of internal circuits 161–168 receives the internal supply voltage Vcc2.

The DRAM 100 shown in FIG. 13 is an example of application of the foregoing embodiments. It is noted that the reference voltage generating circuits in the foregoing embodiments can be applied as the reference voltage generating circuits in various semiconductor devices formed on the semiconductor substrates. In particular, since the reference voltage generating circuit in any embodiment described above can be formed of the MOS transistors, it can be preferably applied to the semiconductor device mainly formed only by the MOS manufacturing steps.

In any of the foregoing embodiments, description has been made on the examples in which the temperature dependency of the output voltage Vo is set as small as possible. It is easily understood that the temperature dependency of the output voltage Vo can be intentionally set at a positive value. For example, in the reference voltage generating circuit 202 shown in FIG. 3, the drain current density of PMOS transistor 4 can be set smaller, whereby the temperature dependency of the output voltage Vo can be set at the positive value. In general, the operation speed of the DRAM decreases, as the ambient temperature increases. However, if the internal supply voltage Vcc2 gradually increases along with the rise of the ambient temperature, the access delay, which may be caused by the rise of temperature, can be prevented. Specifically, the reference voltage generating circuit having the positive temperature dependency of the output voltage Vo is used as the internal voltage converter 200 in the DRAM 100 shown in FIG. 13.

As described above, the reference voltage generating circuit 202, e.g., shown in FIG. 3 is formed in the same manufacturing steps as the other circuits, and the temperature compensation of the reference voltage generating circuit 202 is achieved with the PMOS transistors 3 and 4 having the same characteristics. Therefore, the additional manufacturing step is not required. Further, the circuit does not use, for example, polysilicon resistor and/or diffusion resistor, which may be affected by the variation of the manufacturing conditions of the semiconductor device. Therefore, the stable reference voltage generating circuit is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A reference voltage generating circuit, comprising:
   a constant current source;
   a first field effect transistor having its gate and drain connected together, and receiving an output current from said constant current source as a drain current;
   amplifier means connected to a common connection node of said constant current source and said first field effect transistor; and
   negative feedback circuit means for applying a negative feedback signal to said amplifier means, wherein
   said negative feedback circuit means includes
   resistor means and a second field effect transistor connected in series between an output node of said amplifier means and a supply potential,
   said second field effect transistor having its gate and drain connected together,
   said resistor means and said second field effect transistor having a common connection node through which the negative feedback signal is applied to said amplifier means, said first and second field effect transistors having gate-source voltage and drain current characteristics which are shifted as an ambient temperature rises, and wherein drain currents of said first and second field effect transistors are determined so that temperature coefficients of said gate-source voltages of said first and second field effect transistors are different from each other and satisfy a predetermined mathematical relationship.

2. A reference voltage generating circuit according to claim 1, wherein said amplifier means includes a differential amplifier means having an inverted input node and a noninverted input node, and said differential amplifier means is connected to a common connection node of said constant current source and said first field effect transistor through said noninverted input node, and receives the negative feedback signal through said inverted input node from said negative feedback circuit means.

3. A reference voltage generating circuit according to claim 2, wherein said resistor means includes first and second resistor elements connected in series between an output node of said differential amplifier means and said supply potential; and said differential amplifier means has said inverted input node connected to a common connection node of said first and second resistor elements.

4. A reference voltage generating circuit according to claim 3, wherein all active elements, which form said differential amplifier means and said constant current source, are field effect transistors.

5. A reference voltage generating circuit according to claim 1, wherein said first and second field effect transistors have the same conductivity type as well as the same gate-source voltage and drain current characteristics.

6. A reference voltage generating circuit according to claim 1, wherein said first and second field effect transistors have different conductivity types as well as different gate-drain voltage and source current characteristics.

7. A reference voltage generating circuit, comprising:

a constant current source;

a first field effect transistor having its gate and drain connected together, and receiving an output current from said constant current source as a drain current;

amplifier means connected to a common connection node of said constant current source and said first field effect transistor, wherein said amplifier means includes a differential amplifier means having an inverted input node and a noninverted input node, and said differential amplifier means is connected to a common connection node of said constant current source and said first field effect transistor through said noninverted input node, and receives a negative feedback signal through said inverted input node from a negative feedback means; wherein said negative feedback circuit means includes resistor means and a second field effect transistor connected in series between an output node of said amplifier means and a supply potential, wherein said resistor means includes first and second resistor elements connected in series; and said differential amplifier means has said inverted input node connected to a common connection node of said first and second resistor elements, said second field effect transistor having its gate and drain connected together, said first and second field effect transistors having gate-source voltage and drain current characteristics which are shifted as an ambient temperature rises, wherein drain currents of said first and second field effect transistors are determined so that temperature coefficients of said gate-source voltages of said first and second field effect transistors satisfy a predetermined relationship, and wherein said constant current source includes a third resistor element having a temperature coefficient lower than those of said first and second resistor elements.

8. A reference voltage generating circuit according to claim 7, wherein said first and second resistor elements comprise impurity diffusion regions in a semiconductor substrate, and said third resistor element is a polysilicon resistor.

9. A semiconductor device, comprising:

a semiconductor substrate;

an internal voltage converting circuit formed on said substrate for converting an externally applied external supply voltage into an internal supply voltage; and an internal circuit formed on said substrate for receiving said converted internal supply voltage; wherein said internal voltage converting circuit includes a constant current source receiving said external supply voltage;

a first field effect transistor having its gate and drain connected together, and receiving an output current from said constant current source as a drain current;

amplifier means receiving said eternal supply voltage and connected to a common connection node of said constant current source and said first field effect transistor; and negative feedback circuit means applying a negative feedback signal to said amplifier means, including resistor means and a second field effect transistor connected in series between an output node of said amplifier means and a ground potential, said second field effect transistor having its gate and a drain connected together, said resistor means and said second field effect transistor having a common connection node through which said negative feedback signal is applied to said amplifier means;

said first and second field effect transistors have gate-source voltage and drain current characteristics which are shifted as an ambient temperature rises; and wherein drain currents of said first and second field effect transistors are determined so that temperature coefficients of said gate-source voltages of said first and second field effect transistors are different from each other and satisfy a predetermined mathematical relationship.

10. A semiconductor device comprising:

a semiconductor substrate;

an internal voltage converting circuit formed on said substrate for converting an externally applied external supply voltage into an internal supply voltage; and an internal circuit formed on said substrate for receiving said converted internal supply voltage; wherein said internal voltage converting circuit includes a constant current source receiving said external supply voltage;

a first field effect transistor having its gate and drain connected together, and receiving an output current from said constant current source as a drain current;

amplifier means receiving said external supply voltage and connected to a common connection node of said constant current source and said first field effect transistor; and negative feedback circuit means applying a negative feedback signal to said amplifier means, including resistor means and a second field effect transistor connected in series between an output node of said amplifier means and a ground potential, said second transistor having its gate and a drain connected together, said resistor means and said second field effect transistor having a common connection node through which said negative feedback signal is applied to said amplifier means;

said first and second field effect transistors have gate-source voltage and drain current characteristics which are shifted as an ambient temperature rises; and drain currents of said first and second field effect transistors are determined so that temperature coefficients of said gate-source voltages of said first and second field effect transistors are different from each other and satisfy a predetermined mathematical relationship, wherein said semiconductor device is a semiconductor memory device, and said internal circuit includes a memory cell array, a decoder which addresses said memory cell array in response to an externally applied address signal, and a sense amplifier for amplifying a data signal supplied from said memory cell array.

11. A reference voltage generating circuit which receives an external supply voltage and supplies a temperature-compensated reference voltage as an internal supply voltage for an internal operation circuit, comprising:

a constant current source;

a first field effect transistor having its gate and drain connected together, and receiving an output current of said constant current source as a drain current;

amplifier means connected to a common connection node of said constant current source and said first field effect transistor; and negative feedback circuit means applying a negative feedback signal to said amplifier means, wherein said negative feedback circuit means includes resistor means and a second field effect transistor connected in series between an output node of said amplifier means and a supply potential, said second field effect transistor having its gate and drain connected together, said resistor means and said second field effect transistor having a common connection node through which said negative feedback signal is applied to said amplifier means;

said first and second field effect transistors have gate-source voltage and drain current characteristics which are shifted as an ambient temperature rises, and drain currents of said first and second field effect transistors are determined so that temperature coefficients of said gate-source voltages of said first and second field effect transistors are different from each other and satisfy a predetermined mathematical relationship.

* * * * *